United States Patent
Hsu

(10) Patent No.: US 9,892,673 B2
(45) Date of Patent: Feb. 13, 2018

(54) DISPLAY SUBSTRATE, DISPLAY APPARATUS AND DRIVING METHOD THEREOF

(71) Applicant: BOE TECHNOLOGY GROUP CO., LTD., Beijing (CN)

(72) Inventor: Minghung Hsu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/321,899

(22) PCT Filed: Apr. 29, 2016

(86) PCT No.: PCT/CN2016/080647
§ 371 (c)(1),
(2) Date: Dec. 23, 2016

(87) PCT Pub. No.: WO2016/188302
PCT Pub. Date: Dec. 1, 2016

(65) Prior Publication Data
US 2017/0132965 A1    May 11, 2017

(30) Foreign Application Priority Data

May 22, 2015 (CN) .......................... 2015 1 0266982

(51) Int. Cl.
*G09G 3/20* (2006.01)
*G09G 3/3266* (2016.01)
(Continued)

(52) U.S. Cl.
CPC .......... *G09G 3/2074* (2013.01); *G09G 3/2003* (2013.01); *G09G 3/3266* (2013.01);
(Continued)

(58) Field of Classification Search
CPC .. G09G 3/2074; G09G 3/2003; G09G 3/3266; G09G 3/3275; G09G 2300/0452;
(Continued)

(56) References Cited

U.S. PATENT DOCUMENTS

2004/0051835 A1   3/2004  Hsieh et al.
2005/0259052 A1*  11/2005  Shin ...................... G09G 3/325
                                                                          345/77
(Continued)

FOREIGN PATENT DOCUMENTS

| CN | 1952764 A | 4/2007 |
|---|---|---|
| CN | 101216650 A | 7/2008 |
| CN | 101551973 A | 10/2009 |
| CN | 103268043 A | 8/2013 |
| CN | 103366683 A | 10/2013 |
| CN | 104835451 A | 8/2015 |
| KR | 1020110100930 A | 9/2011 |

(Continued)

OTHER PUBLICATIONS

International Search Report and Written Opinion dated Jul. 22, 2016; PCT/CN2016/080647.
(Continued)

*Primary Examiner* — Stephen Sherman
(74) *Attorney, Agent, or Firm* — Ladas & Parry LLP

(57) ABSTRACT

A display substrate, display device and driving method thereof. While providing an increased resolution, the display device also has an increased aperture ratio. The display substrate comprises a plurality of pixel units (10) arranged in a matrix. The R sub-pixel, G sub-pixel, and B sub-pixel in each of the plurality of pixel units (10) are connected to a first data line (31), wherein the first data line (31) is configured to provide an R signal to the R sub-pixel in a first time duration (t1), and a B signal to the B sub-pixel in a second time duration (t2). In each of the plurality of pixel units (10), the G sub-pixel is connected to a second data line (32) configured to provide a G signal to the G sub-pixel in the first time duration (t1) and second time duration (t2).

16 Claims, 9 Drawing Sheets

(51) Int. Cl.
*G09G 3/3275* (2016.01)
*H01L 27/32* (2006.01)

(52) U.S. Cl.
CPC ........ *G09G 3/3275* (2013.01); *H01L 27/3211* (2013.01); *H01L 27/3213* (2013.01); *H01L 27/3262* (2013.01); *H01L 27/3265* (2013.01); *H01L 27/3276* (2013.01); *G09G 2300/0452* (2013.01); *G09G 2300/0809* (2013.01); *G09G 2310/0202* (2013.01); *G09G 2320/0646* (2013.01); *G09G 2320/0666* (2013.01)

(58) Field of Classification Search
CPC ... G09G 2300/0809; G09G 2310/0202; G09G 2320/0646; G09G 2320/0666; H01L 27/3211; H01L 27/3213; H01L 27/3262; H01L 27/3265; H01L 27/3276
USPC .......................................................... 345/694
See application file for complete search history.

(56) References Cited

U.S. PATENT DOCUMENTS

2007/0085797 A1\* 4/2007 Kim .................. G02F 1/136286
  345/93
2011/0170031 A1\* 7/2011 Son ...................... G09G 3/3659
  349/46

FOREIGN PATENT DOCUMENTS

KR    1020140064158 A    5/2014
KR    1020140079089 A    6/2014

OTHER PUBLICATIONS

First Chinese Office Action dated Dec. 5, 2016; Appln. No. 201510266982.3.

\* cited by examiner

DISPLAY SUBSTRATE, DISPLAY APPARATUS AND DRIVING METHOD THEREOF

TECHNICAL FIELD

Embodiments of the present disclosure relate to a display substrate, a display apparatus and the driving method thereof.

BACKGROUND

OLED (Organic Light-Emitting Diode) displays have been widely used for the display technology field. Currently, display products having high granularity and high resolution have become the main developing trend.

Referring to FIG. 1, an OLED display panel generally includes a plurality of scan lines 1, a plurality of data lines 2 crossing the plurality of scan lines 1, and a plurality of sub-pixels 3 arranged in a matrix, wherein, each of the sub-pixels 3 is connected with one scan line I and one data line 2 respectively. The principle for driving a display panel is: in a scanning period, a scanning signal is input to sub-pixels in the same row by one scan line, different data signals are input to corresponding sub-pixels by the plurality of data lines, and therefore the displaying of one row is achieved. Then the displaying of one frame of a picture may be implemented by repeating the above-mentioned steps.

The sub-pixels may be classified as red (R) sub-pixels, green (G) sub-pixels and blue (B) sub-pixels based on their emitting color, and three adjacent R sub-pixel, G sub-pixel, and B sub-pixel may form one pixel unit. A principle for implementing colorization display by the OLED display panel is: the sub-pixel emits light by an organic electroluminescence layer included therein, and a luminance of the organic electroluminescence layer for emitting light is related to a current, and thereafter amounts of the current of the three R, G, B sub-pixels may be controlled respectively, so that these three sub-pixels emit light of different luminance; and further since a size of each pixel unit is very small, the light emitted by the R, G, B three sub-pixels may be mixed visually, and therefore the color to be displayed by each pixel unit is formed.

As known from the principle for implementing colorization display by a IDLED display panel described above, in case that the size of the display panel remains constant, larger the number of the pixel units is, higher a resolution of the display panel is and better the displaying effect is. However, as known from the above-mentioned driving principle, an increasing of the number of pixel units leads inevitably to an increasing of the number of sub-pixels, and then the number of data lines for driving sub-pixels may also increase accordingly; and in this way, on the one hand, the resolution is improved, but on the other hand, an aperture ratio is reduced, and the aperture ratio is also an important factor affecting the displaying effect. The technical problem needed to be solved by those skilled in the art is how to improve the aperture ratio while improving the aperture ratio.

SUMMARY

Embodiments of the present disclosure provide a display substrate, a display apparatus and the driving method thereof, the display apparatus has a higher aperture ratio while having a higher resolution.

According to a first aspect of the present disclosure, there is provided a display substrate, comprising: a plurality of pixel units arranged in an array, each of the pixel units at least comprises a R sub-pixel, a G sub-pixel and a B sub-pixel; and the R sub-pixel, the G sub-pixel and the B sub-pixel of the pixel unit in each row are connected with one first scan line; in each of the pixel units, the R sub-pixel and the B sub-pixel are connected with one first data line, and the first data line is configured to provide a R data signal to the R sub-pixel during a first time period and to provide a B data signal to the B sub-pixel during a second time period; in each of the pixel units, the G sub-pixel is connected with one second data line, and the second data line is configured to provide a G data signal to the G sub-pixel during the first time period and the second time period; wherein, the first time period and the second time period are different time periods.

An embodiment of the present disclosure provides a display apparatus comprising, the display substrate described above.

An embodiment of the present disclosure provides a method for driving a display apparatus, the display apparatus comprises the display substrate described above, the driving method comprises: during a first scanning period, a scanning signal is input to the R sub-pixel, the G sub-pixel and the B sub-pixel in the pixel unit by the first scan line; during a first time period of the first scanning period, a R data signal is input to the R sub-pixel by the first data line; during a second time period of the first scanning period, a B data signal is input to the B sub-pixel by the first data line; during the first time period and the second time period of the first scanning period, a G data signal is input to the G sub-pixel by the second data line; wherein, the first time period and the second time period of the first scanning period are different time periods.

According to a second aspect of the present disclosure, there is provided another display substrate, comprising: a plurality of virtual pixel units arranged in an array, each of the virtual pixel units comprises a first virtual sub-pixel unit and a second virtual sub-pixel unit, the first virtual sub-pixel unit comprises a R sub-pixel and a first G sub-pixel, and the second virtual sub-pixel unit comprises a B sub-pixel and a second G sub-pixel; each of the R sub-pixel, the first G sub-pixel, the B sub-pixel and the second G sub-pixel in the virtual pixel unit of each row is connected with one first scan line; in each of the virtual pixel units, the R sub-pixel of the first virtual sub-pixel unit and the B sub-pixel of the second virtual sub-pixel unit are connected with one first data line, the first data line is configured to provide a R data signal to the R sub-pixel during a first time period and to provide a B data signal to the B sub-pixel during a second time period; in each of the virtual pixel units, the first G sub-pixel of the first virtual sub-pixel unit is connected with one fourth data line, and the second G sub-pixel of the second virtual sub-pixel unit is connected with one fifth data line, the fourth data line is configured to provide a first G data signal to the first G sub-pixel during the first time period and the second time period, and the fifth data line is configured to provide a second G data signal to the second G sub-pixel during the first time period and the second time period; wherein, the first time period and the second time period are different time periods.

An embodiment of the present disclosure provides another display apparatus comprising the display substrate described above.

An embodiment of the present disclosure provides another method for driving a display apparatus, the display apparatus comprises the display substrate described above, the driving method comprises: during a first scanning period, a scanning signal is input to the R sub-pixel, the first G sub-pixel, the B sub-pixel and the second G sub-pixel in the virtual pixel unit by the first scan line; during a first time period of the first scanning period, a R data signal is input to the R sub-pixel by the first data line; during a second time period of the first scanning period, a B data signal is input to the B sub-pixel by the first data line; during the first time period and the second time period of the first scanning period, a first G data signal is provided to the first G sub-pixel by the fourth data line, and a second G data signal is provided to the second G sub-pixel by the fifth data line; wherein, the first time period and the second time period are different time periods.

An embodiment of the present disclosure provides a display substrate, the display substrate comprises a plurality of pixel units, and each of the pixel units at least comprises a R sub-pixel, a G sub-pixel and a B sub-pixel; and the R sub-pixel, the G sub-pixel and the B sub-pixel of the pixel unit in each row is connected with one first scan line; in each of the pixel units, the R sub-pixel and B sub-pixel are connected with one first data line, and the G sub-pixel is connected with a second data line; the first data line is configured to provide a R data signal to the R sub-pixel during a first time period and to provide a B data signal to the B sub-pixel during a second time period; and the second data line is configured to provide a G data signal to the G sub-pixel during the first time period and the second time period, and the first time period and the second time period are different time periods.

Since the R sub-pixel and the B sub-pixel in each pixel unit share one first data line, as compared with a display apparatus in which each sub-pixel needs one corresponding data line to be driven, in the display apparatus comprising the display substrate as described above, the number of the data lines are reduced greatly, and thus the display apparatus has a higher aperture ratio while having the same high resolution.

BRIEF DESCRIPTION OF THE DRAWINGS

In order to explain solutions in embodiments of the present disclosure or the prior art more clearly, drawings required as describing the embodiments of the present disclosure or the prior art will be introduced briefly below. Obviously, the drawings described below are only some embodiments of the present disclosure, but those ordinary skilled in the art may obtain other drawings according to these drawings without any inventive labors.

REFERENCE SIGNS

Figure 1:
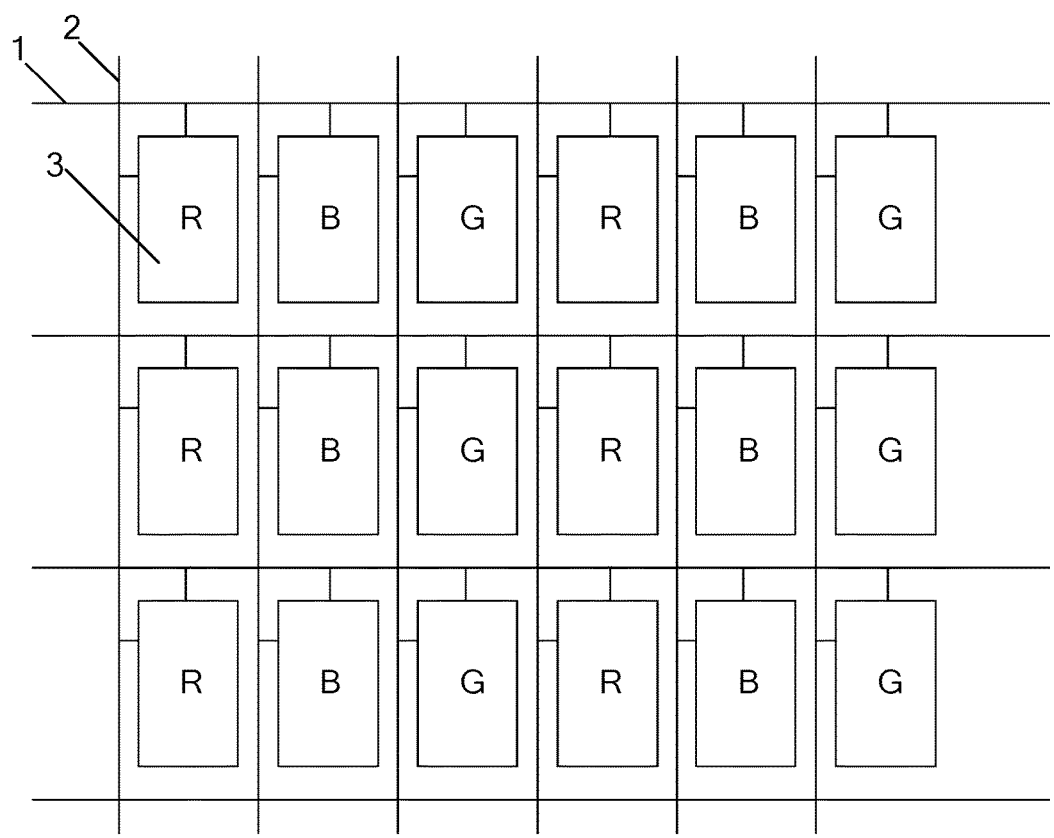
FIG. 1 is a structural representation of an OLED display panel provided in the prior art.

1—scan line; 2—data line; 3—sub-pixel; 10—pixel unit; 21—first scan line; 22—second scan line; 31—first data line; 32—second data line; 34—fourth data line; 35—fifth data line; 41—first control unit; 42—second control unit; 43—third control unit; 51—first driving unit; 52—second driving unit; 53—third driving unit; 60—organic light emitting diode; 200—substrate; 201—first gate; 202—gate insulator layer; 203—active layer; 204—etching stop layer; 205—source; 206—drain; 207—passivating layer; 208—second gate; 11—virtual pixel unit; 111—first virtual pixel unit; 112—second virtual pixel unit.

DETAILED DESCRIPTION

Thereafter, solutions of embodiments of the present disclosure will be described clearly and completely in connection with drawings of the embodiments of the present disclosure, but obviously the described embodiments are only some, but not all of the embodiments of the present disclosure. Any other embodiments obtained by those ordinary skilled in the art based on the embodiments of the present disclosure without inventive labors should fall into a scope sought for protection in the present disclosure.

It should be noted that there are generally two approaches for arranging the pixels in an OLED display apparatus: a standard RGB arrangement approach and a P arrangement (Pentile arrangement) approach. The standard RGB arrangement is configured to divide one pixel unit into three, namely R, G, B, sub-pixels equally; and a single pixel unit subjected to P arrangement has only two sub-pixels, namely R, G or B, G sub-pixels. The standard RGB arrangement is based on a principle of three primary colors, and a color displaying of one pixel is implemented through the R, G, B sub-pixels; in the P arrangement, by means of sharing a sub-pixel between adjacent pixels, i.e., each pixel and its adjacent pixel share the sub-pixel whose color is not owned in the pixels themselves, the display is implemented. In the standard RGB arrangement, the light emitting areas of the three sub-pixels in one pixel are same, while in the P arrangement, the light emitting area of the R sub-pixel or B sub-pixel in the single pixel is twice the light emitting area of the G sub-pixel. By using the P arrangement, the number of the sub-pixels can be reduced, thereby an effect of simulating the high resolution with a low resolution is achieved, and its advantages are in that a visual luminance is higher and a cost is lower under the same luminance; however, a definition will be decreased greatly as displaying contents of high granularity. Hereinafter, by referring to a first embodiment and a second embodiment, the embodiments of the present disclosure based on different pixel arrangement approaches are explained in particular.

It should be further noted that sources and drains of a thin film transistor in all embodiments of the present disclosure are symmetric, and therefore there is no discrimination between a source and a drain. In embodiments of the present disclosure, in order to make a distinction between two electrode except for a gate of the thin film transistor, one electrode is referred to as the source, and the other electrode is referred to as the drain. In addition, the transistors may be classified as N type and P type transistors based on characters of the thin film transistors, and in the following embodiments, explanations are made by taking N type thin film transistors as an example. It is conceivable that implementation with a P type thin film transistors can easily occur to any skilled pertaining to the art without any inventive labors and it also falls in the protection scope of embodiments of the present disclosure.

First Embodiment

Figure 2:
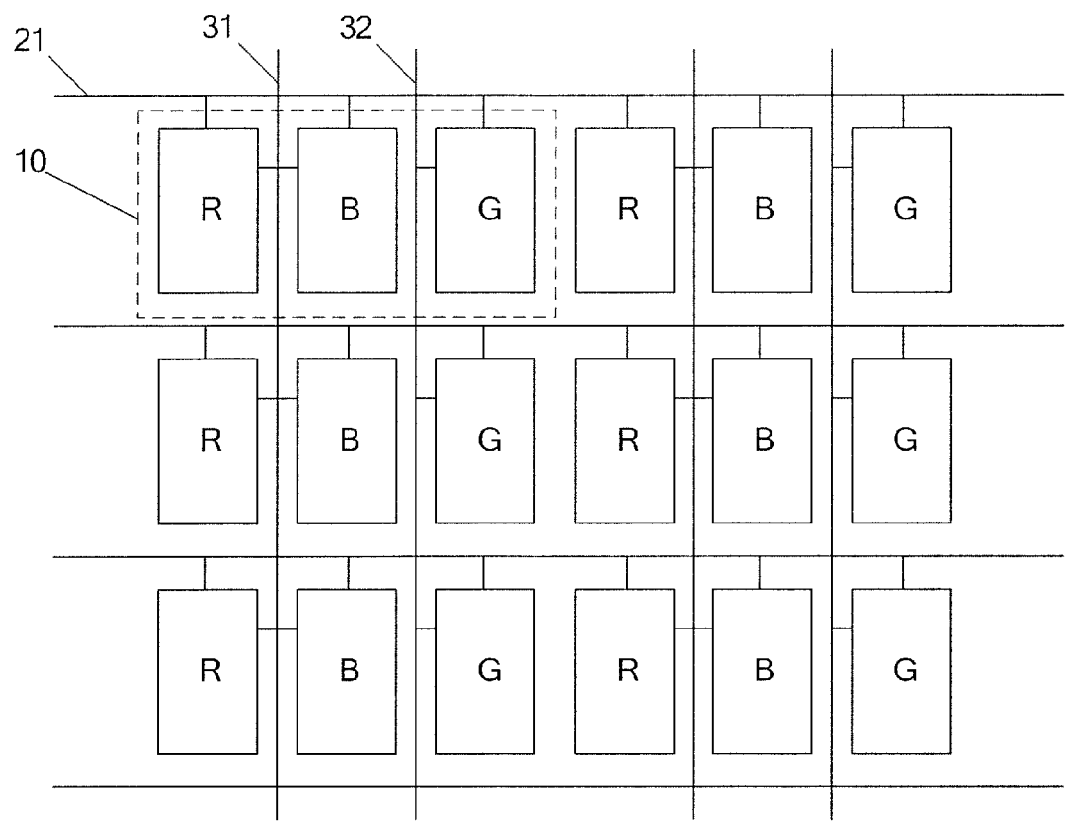
FIG. 2 is a structural representation of a display substrate according to an embodiment of the present disclosure.

An embodiment of the present disclosure provides a display substrate, referring to FIG. 2, the display substrate comprises a plurality of pixel units 10 arranged in an array, and each of the pixel units 10 at least comprises a R sub-pixel, a G sub-pixel and a B sub-pixel; each of the R sub-pixels, G sub-pixels and B sub-pixels of the pixel units 10 in each row is connected with one first scan line 21; in each of the pixel units, the R sub-pixel and B sub-pixel are connected with one first data line 31, and the first data line 31 is configured to provide a R data signal to the R sub-pixel during a first time period and to provide a B data signal to the B sub-pixel during a second time period. p In each of the pixel units 10, the G sub-pixel is connected with one second data line 32, and the second data line 32 is configured to provide a G data signal to the G sub-pixel during the first time period and the second time period; wherein, the first time period and the second time period are different time periods.

In the display substrate as described above, the number of sub-pixels included in each pixel unit and the type thereof are not limited in embodiments of the present disclosure. Specifically, each pixel unit may only comprise a R sub-pixel, a G sub-pixel and a B sub-pixel; of course, to improve a displaying brightness, each pixel unit may also comprise a R sub-pixel, a G sub-pixel, a B sub-pixel and a W (white) sub-pixel; the embodiments of the present disclosure is not limited thereto, and the implementation of each pixel unit may be determined depending on actual situations. In addition, the number of each sub-pixel included in each pixel unit and the area thereof are not limited in embodiments of the present disclosure. Specifically, explanations are made as follows by taking the R sub-pixel included in each pixel unit as an example. Each pixel unit may comprise one R sub-pixel, of course, it may also comprise two R sub-pixels, as well as a plurality of R sub-pixels, and enumeration will not made here. Meanwhile, in case that each pixel unit comprises a plurality of R sub-pixels, shapes and areas of the plurality of R sub-pixels may be the same or may be different, and there is no limitation on it herein, as long as all R sub-pixels and all B sub-pixels in each pixel unit are connected with one first data line. Embodiments of the present disclosure and the attached figures are all explained by taking a case that each pixel unit only comprises three sub-pixels, namely the R sub-pixel, G sub-pixel and B sub-pixel, which are of same area and shape, as an example.

In the display substrate as described above, the R sub-pixel and B sub-pixel in each pixel unit are connected with one first data line, and specifically, for example, if each row comprises M (M is a natural number) pixel units, the R sub-pixel and B sub-pixel in the Nth (N is a natural number being not greater than M) pixel unit are connected with the Nth first data line, i.e., the R sub-pixel and B sub-pixel in each of the pixel units correspond to a respective first data line.

In the display substrate as described above, the display substrate comprises a plurality of pixel units arranged in an array, and then the plurality of pixel units may be arranged by column, and may also be arranged by row. There is no limitation in the embodiments of the present disclosure. It should be noted that the term "each row" described in the embodiments of the present disclosure is only for describing the present disclosure easily and simplifying the description, rather than indicating or suggesting that the apparatus or element as described must have a specific orientation and be configured or operated in the specific orientation, and should not be construed as limiting the present disclosure.

An embodiment of the present disclosure provides a display substrate, the display substrate comprises a plurality of pixel units arranged in an array, and each of the pixel units at least comprises a R sub-pixel, a G sub-pixel and a B sub-pixel; and the R sub-pixels, the G sub-pixels and the B sub-pixels of the pixel units in each row is connected with one first scan line; in each of the pixel units, the R sub-pixel and B sub-pixel are connected with one first data line, and the G sub-pixel is connected with a second data line; the first data line is configured to provide a R data signal to the R sub-pixel during a first time period and to provide a B data signal to the B sub-pixel during a second time period; and the second data line is configured to provide a G data signal to the G sub-pixel during the first time period and the second time period, and the first time period and the second time period are different time periods.

As compared with a display apparatus in which each sub-pixel needs an individual data line to be driven, for a display apparatus comprising the display substrate as described above, the number of the data lines are reduced greatly and thus the display apparatus can have a higher aperture ratio with the same high resolution, because the R sub-pixel and the B sub-pixel in each pixel unit share the one first data line.

Figure 3:
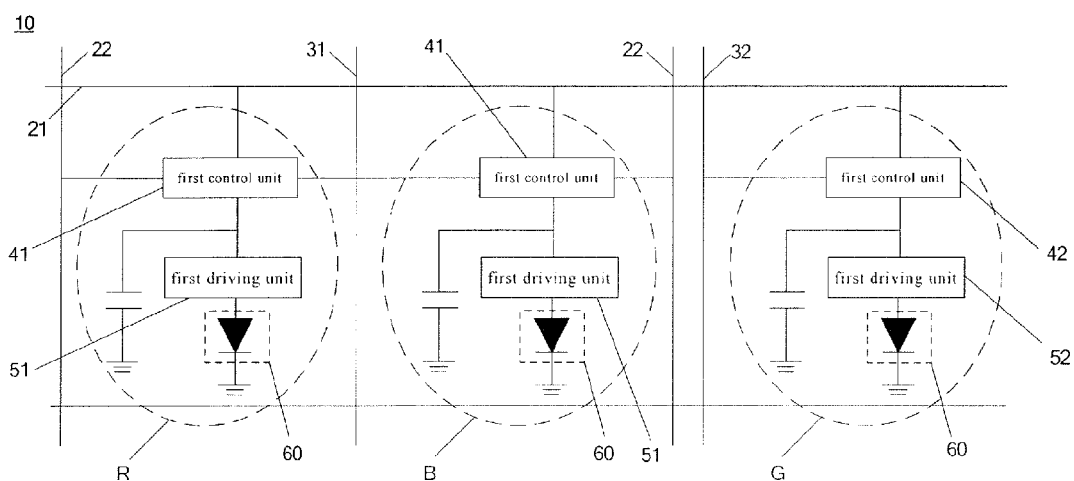
FIG. 3 is a structural representation of the pixel unit 10 in FIG. 2.

Optionally, referring to FIG. 3, each of the R sub-pixel and the B sub-pixel in each of the pixel units 10 in the display substrate as described above may comprise a first control unit 41, a first driving unit 51, and an organic light emitting diode 60. Wherein, the first control unit 41 is connected with the first scan line 21, the second scan line 22, the first data line 31, and the corresponding first driving unit 51 respectively.

During the first time period, under the control of the second scan line connected with the R sub-pixels, the first control unit of the R sub-pixel is configured to input a R data signal provided by the first data line to the first driving unit in the R sub-pixel so as to drive the organic light emitting diode to emit light; and during the second time period, under the control of the second scan line connected with the B sub-pixel, the first control unit of the B sub-pixel is configured to input the B data signal provided by the first data line to the first driving unit in the B sub-pixel so as to drive the organic light emitting diode to emit light.

The display substrate may be used for forming an OLED display device, and the OLED display device has features such as autoluminescence, wide viewing angle and quick reaction rate.

It should be noted that the first control unit described above may have various circuit structures, and there is no limitation in embodiments of the present disclosure, as long as the control function described above can be achieved.

Two types of circuit structures are provided below to explain embodiments of the present disclosure in detail.

Figure 4:
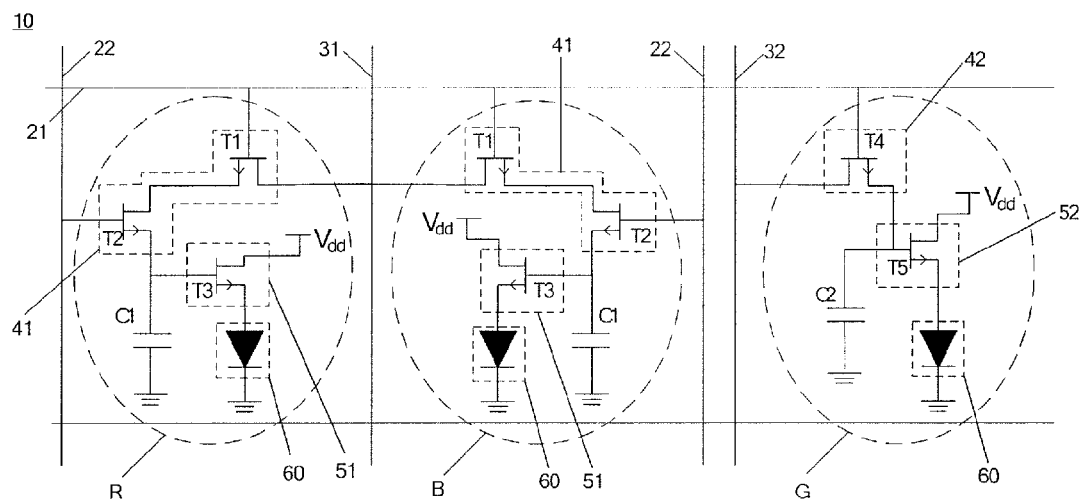
FIG. 4 is another structural representation of the pixel unit 10 in FIG. 2.

Regarding a first type of circuit structure, referring to FIG. 4, the first control unit 41 may comprise a first thin film transistor T1 and a second thin film transistor T2.

Specifically, a gate of the first thin film transistor T1 is connected with the first scan line 21, and a drain of the first thin film transistor T1 is connected with a source of the second thin film transistor T2, and a source of the first thin film transistor T1 is connected with the first data line 31; and a gate of the second thin film transistor T2 is connected with the second scan line 22, and a drain of the second thin film transistor T2 is connected with the first driving unit 51.

Figure 5:
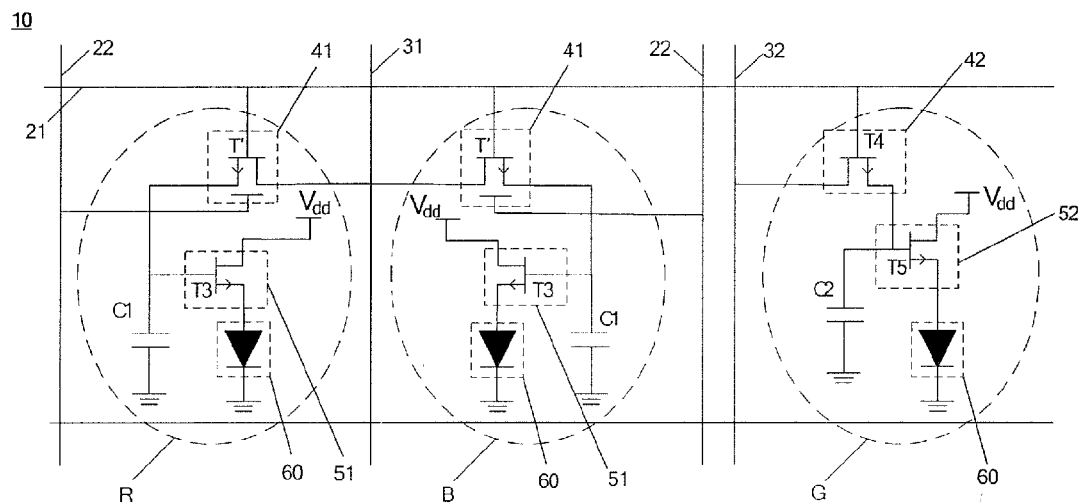
FIG. 5 is yet another structural representation of the pixel unit 10 in FIG. 2.

Regarding a second type of circuit structure, referring to FIG. 5, the first control unit 41 may further comprise a Dual-Gate type thin film transistor T'.

Specifically, a first gate of the Dual-Gate type thin film transistor T' is connected with the first scan line 21, a second gate of the Dual-Gate type thin film transistor T' is connected with the second scan line 22, a drain of the Dual-Gate type thin film transistor T' is connected with the first driving unit 51, and a source of the Dual-Gate type thin film transistor T' is connected with the first data line 31.

Figure 6:
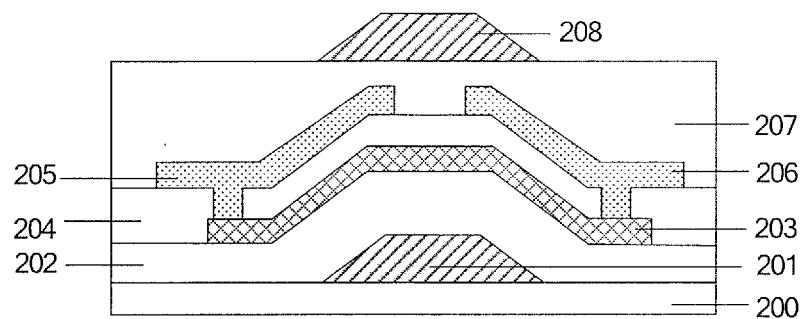
FIG. 6 is a structural representation of the Dual-Gate type thin film transistor T' in FIG. 5.

Referring to FIG. 6, a method for manufacturing the Dual-Gate type thin film transistor may comprise forming a first gate 201, a gate insulator layer 202, an active layer 203, an etching stop layer 204, a source 205, a drain 206, a passivating layer 207 and a second gate 208 on a substrate 200 in sequence, but of course the Dual-Gate type thin film transistor may be manufactured by other manufacture methods, and there is no specific limitation herein. It should be noted here that the second gate 208 may be transparent and may be opaque, and there is no limitation on it, and it may be designed according to actual situations.

In a case that the second gate is opaque, the above described Dual-Gate type thin film transistor may be used for forming a bottom emitting OLED display device. Specifically, in the bottom emitting OLED display device, a transparent oxide such as IGZO (Indium Gallium Zinc Oxide) is generally employed to form the active layer; however, the IGZO is susceptible to illumination, and a metal layer is added at a position corresponding to the active layer above the passivating layer for shielding the light. When the Dual-Gate type thin film transistor is employed to form the bottom emitting OLED display device, the second gate may be made opaque to replace the metal layer to perform a function of light shielding, and therefore the the metal layer can be omitted, and thus the cost is decreased.

Optionally, referring to FIGS. 4 and 5, the first driving unit 51 may comprise a third thin film transistor T3.

Specifically, a gate of the third thin film transistor T3 is connected with the first control unit 41, namely the drain of the second thin film transistor T2 or the drain of the Dual-Gate type thin film transistor T', a source of the third thin film transistor T3 is connected with a power line Vdd, and a drain of the third thin film transistor T3 is connected with an organic light emitting diode 60. It should be noted here that the first driving unit may also be formed of other circuit components and parts, and there is no limitation on it, as long as the organic light emitting diode may be driven to emit light under the control of the first control unit.

Optionally, referring to FIG. 4 and FIG. 5, each of the R sub-pixel and the B sub-pixel may further comprise a storage capacitor C1, and one terminal of the storage capacitor C1 is connected with the first control unit 41 and the first driving unit 51, and the other terminal is grounded.

A functure of the storage capacitor would be explained by taking the storage capacitor included in the R sub-pixel as an example. Specifically, in the first time period, the storage capacitor may be charged via the first control unit to store a R data signal, and in the second time period, the storage capacitor may provide the R data signal by discharging to the first control unit to. The storage capacitor may cause the R sub-pixel to maintain the displaying of the first time period until the second time period is end, and so that the displaying of the R sub-pixel may be guaranteed to be uninterrupted. It should be noted that the number of the storage capacitors is not limited in embodiments of the present disclosure, and there is no limitation on it; and embodiments of the present disclosure and the attached figures are explained by taking a case that each of the R sub-pixel and the B sub-pixel comprises one storage capacitor as an example.

Optionally, referring to FIG. 3, the G sub-pixel in each pixel unit may comprise a second control unit 42, a second driving unit 52, and an organic light emitting diode 60. Wherein, the second control unit 42 is connected with the first scan line 21, the second data line 32, and the second driving unit 52 respectively.

Optionally, referring to FIG. 4 and FIG. 5, the second control unit 42 may comprise a fourth thin film transistor T4. Specifically, a gate of the fourth thin film transistor T4 is connected with the first scan line 21, a source of the fourth thin film transistor T4 is connected with the second data line 32, and a drain of the fourth thin film transistor T4 is connected with the second driving unit 52. Optionally, the second driving unit 52 may comprise a fifth thin film transistor T5. Specifically, a gate of the fifth thin film transistor T5 is connected with the drain of the fourth thin film transistor T4 of the second control unit 52, a source of the fifth thin film transistor T5 is connected with a power line, and a drain of the fifth thin film transistor T5 is connected with the organic light emitting diode. Of course, the G sub-pixel may further comprise a storage capacitor C2, and one terminal of the storage capacitor C2 is connected with the second control unit 42 and the second driving unit 52 respectively, and the other terminal is grounded.

Optionally, to improve a displaying brightness of the pixel unit, each pixel unit may also comprise a W (white) sub-pixel, and the W sub-pixel in the pixel unit is connected with one third data line, and the third data line is configured to provide a W data signal to the W sub-pixel during the first time period and the second time period; and the W sub-pixel is also connected with the first scan line. The structure of the W sub-pixel may be similar to the structure of the G sub-pixel, and the details will not be repeated herein.

Second Embodiment

Figure 7:
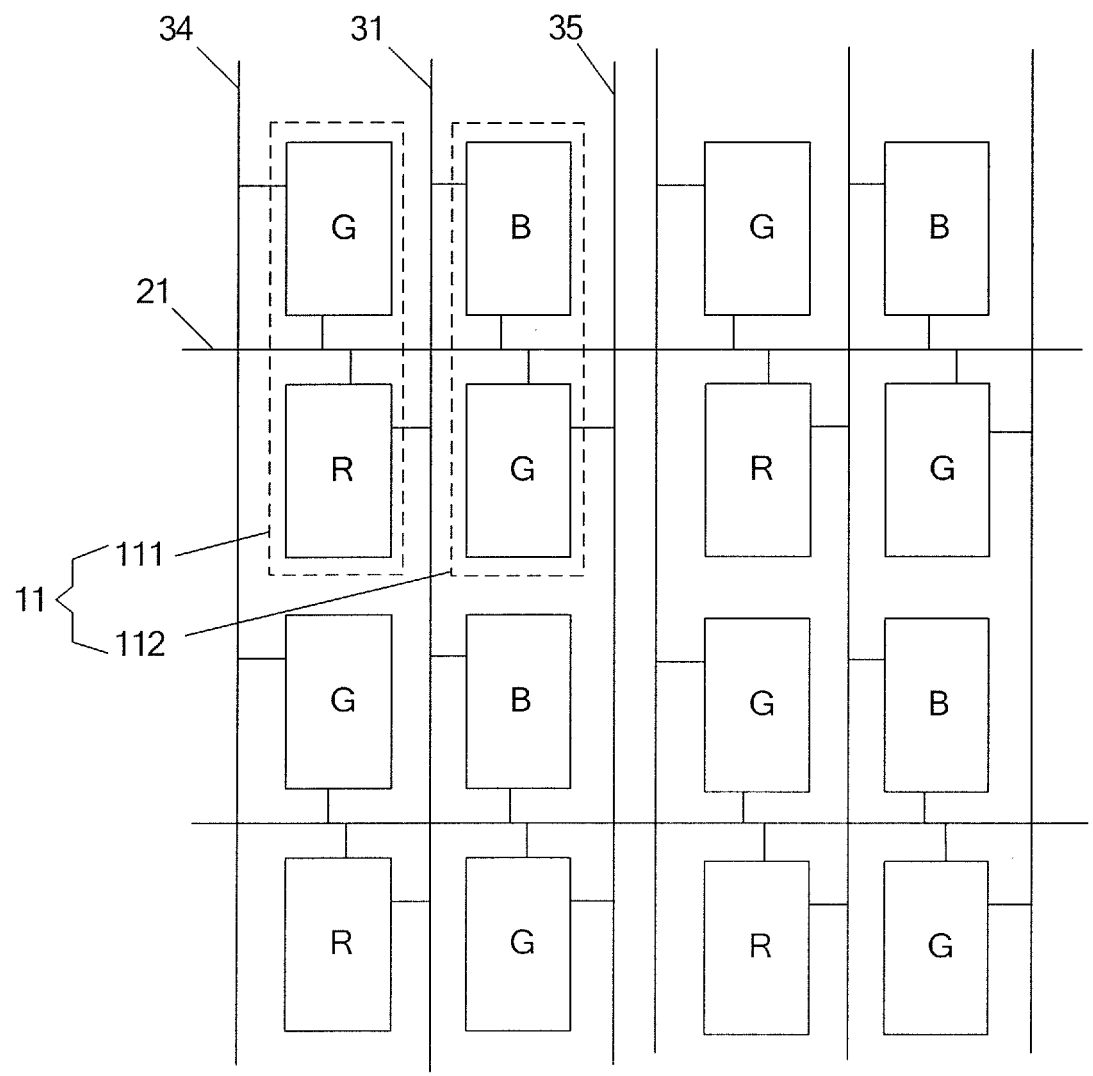
FIG. 7 is a structural representation of another display substrate according to an embodiment of the present disclosure.

An embodiment of the present disclosure provides a display substrate, referring to FIG. 7, the display substrate comprises a plurality of virtual pixel units 11 arranged in an array, each of the virtual pixel units 11 comprises a first virtual sub-pixel unit 111 and a second virtual sub-pixel unit 112, and the first virtual sub-pixel unit 111 comprises a R sub-pixel and a first G sub-pixel, the second virtual sub-pixel unit 112 comprises a B sub-pixel and a second G sub-pixel; and the R sub-pixels, the first G sub-pixels, the B sub-pixels and the second G sub-pixels of the virtual pixel units in each row are connected with one first scan line 21.

In each of the virtual pixel units 11, the R sub-pixel of the first virtual sub-pixel unit 111 and the B sub-pixel of the second virtual sub-pixel unit 112 are connected with one first data line 31, and the first data line 31 is configured to provide a R data signal to the R sub-pixel during the first time period and to provide a B data signal to the B sub-pixel during the second time period.

In each of the virtual pixel units 11, the first G sub-pixel of the first virtual sub-pixel unit 111 is connected with one fourth data line 34, and the second G sub-pixel in the second virtual sub-pixel unit 112 is connected with one fifth data line 35, and the fourth data line 34 is configured to provide a first G data signal to the first G sub-pixel during the first time period and the second time period, and the fifth data line 35 is configured to provide a second G data signal to the second G sub-pixel during the first time period and the second time period; wherein, the first time period and the second time period are different time periods.

In the display substrate as described above, the embodiments of the present disclosure have no limitation on how to arrange the first virtual sub-pixel unit and the second virtual sub-pixel unit included in each virtual pixel unit, specifically, the first virtual sub-pixel unit and the second virtual sub-pixel unit may be arranged by row, but of course, they may also be arranged by column. In addition, the embodiments of the present disclosure have no limitation on how to arrange the R sub-pixel and the first G sub-pixel included in the first virtual pixel unit and the B sub-pixel and the second G sub-pixel included in the second virtual sub-pixel unit. The embodiments of the present disclosure and the drawings are all explained by taking a case that the first virtual sub-pixel unit and the second virtual sub-pixel unit arranged by row form one virtual pixel unit, and the R sub-pixel and the B sub-pixel are arranged diagonally as an example.

In the display substrate as described above, no limitation is made on areas of the sub-pixels included in each virtual sub-pixel unit in the embodiments of the present disclosure. Specifically, by taking a first virtual sub-pixel unit as an example, the first virtual sub-pixel unit comprises a first G sub-pixel and a R sub-pixel, and the areas of the first G sub-pixel and the R sub-pixel may be the same or may be different.

In the display substrate as described above, the display substrate comprises a plurality of virtual pixel units arranged in an array, and then the plurality of virtual pixel units may be arranged by column, and may also be arranged by row. There is no limitation in the embodiments of the present disclosure. It should be noted that the term "each row" described in embodiments of the present disclosure is only for describing the present disclosure easily and simplifying the description, rather than indicating or suggesting, that the apparatus or element as specified must have a specific orientation, and be configured and operated in the specific orientation, and should not be construed as limiting the present disclosure.

In the display substrate as described above, in each virtual pixel unit, the R sub-pixel of the first virtual sub-pixel unit and the B sub-pixel of the second virtual sub-pixel unit are connected with one first data line, and specifically, for example, each row comprises M (M is a natural number) virtual pixel units, the R sub-pixel and B sub-pixel in the Nth (N is a natural number being not greater than M) virtual pixel unit are connected with the Nth first data line, i.e., the R sub-pixel and B sub-pixel in each of the virtual pixel units correspond to the one first data line.

An embodiment of the present disclosure provides a display substrate, the display substrate comprises a plurality of virtual pixel units arranged in an array, and each of the virtual pixel units comprises a first virtual sub-pixel unit and a second virtual sub-pixel unit, and the first virtual sub-pixel unit comprises a R sub-pixel and a first G sub-pixel, the second virtual sub-pixel unit comprises a B sub-pixel and a second G sub-pixel; the R sub-pixels, the first G sub-pixels, the B sub-pixels and the second G sub-pixels of the virtual pixel units in each row are connected with one first scan line; in each virtual pixel unit, the R sub-pixel of the first virtual sub-pixel unit and the B sub-pixel of the second virtual sub-pixel unit are connected with one first data line, and the first data line is configured to provide a R data signal to the R sub-pixel during the first time period and to provide a B data signal to the B sub-pixel during the second time period; in each virtual pixel unit, the first G sub-pixel of the first virtual sub-pixel unit is connected with one fourth data line, and the second G sub-pixel of the second virtual sub-pixel unit is connected with the fifth data line, and the fourth data line is configured to provide a first G data signal to the first G sub-pixel during the first time period and the second time period, and the fifth data line is configured to provide a second G data signal to the second G sub-pixel during the first time period and the second time period.

As compared with a display apparatus in which each sub-pixel needs an individual data line to be driven, for a display apparatus comprising the display substrate as described above, the number of the data lines are reduced greatly and thus the display apparatus can have a higher aperture ratio with the same high resolution, because the R sub-pixel and the B sub-pixel in each pixel unit share the one first data line.

Figure 8:
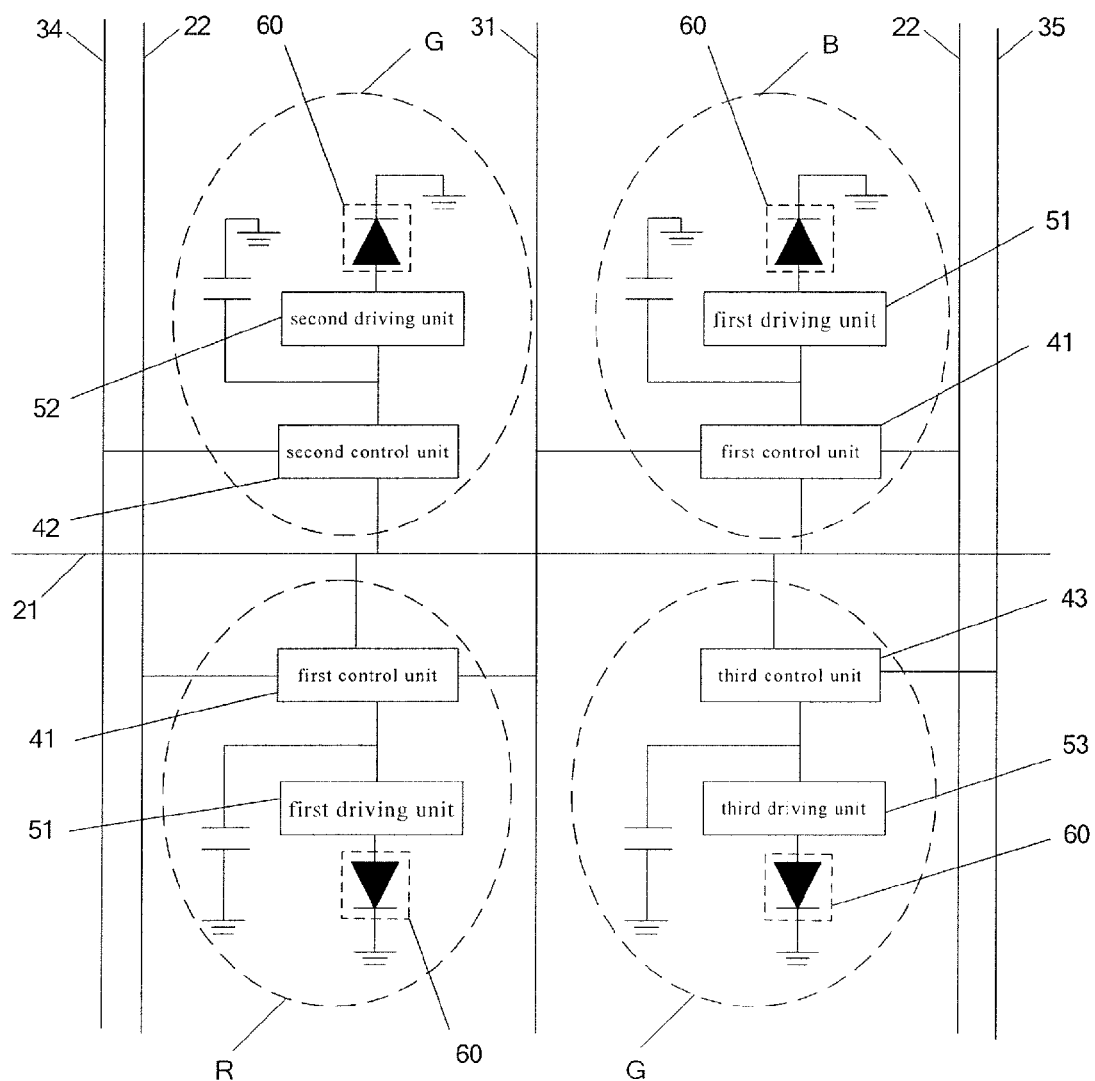
FIG. 8 is a structural representation of the virtual pixel unit 11 in FIG. 7.

Optionally, referring to FIG. 8, each of the R sub-pixel and the B sub-pixel in each of the virtual pixel units in the display substrate as described above may comprise a first control unit 41, a first driving unit 51, and an organic light emitting diode 60. The first control unit 41 is connected with the first scan line 21, the second scan line 22, the first data line 31, and the first driving unit 51 respectively. During the first time period, under the control of the second scan line connected with the R sub-pixel, the first control unit of the R sub-pixel is configured to input the R data signal provided by the first data line to the first driving unit of the R sub-pixel so as to drive the organic light emitting diode to emit light; and during the second time period, under the control of the second scan line connected with the B sub-pixel, the first control unit of the B sub-pixel is configured to input the B data signal provided by the first data line to the first driving unit of the B sub-pixel so as to drive the organic light emitting diode to emit light. The display substrate may be used for forming an OLED display device, and the OLED display device has features such as autoluminescence, wide viewing angle and quick reaction rate.

It should be noted that the first control unit described above may have various circuit structures, and there is no limitation in embodiments of the present disclosure, as long as the control function described above can be achieved. Two types of circuit structures are provided below to explain embodiments of the present disclosure in detail.

Figure 9:
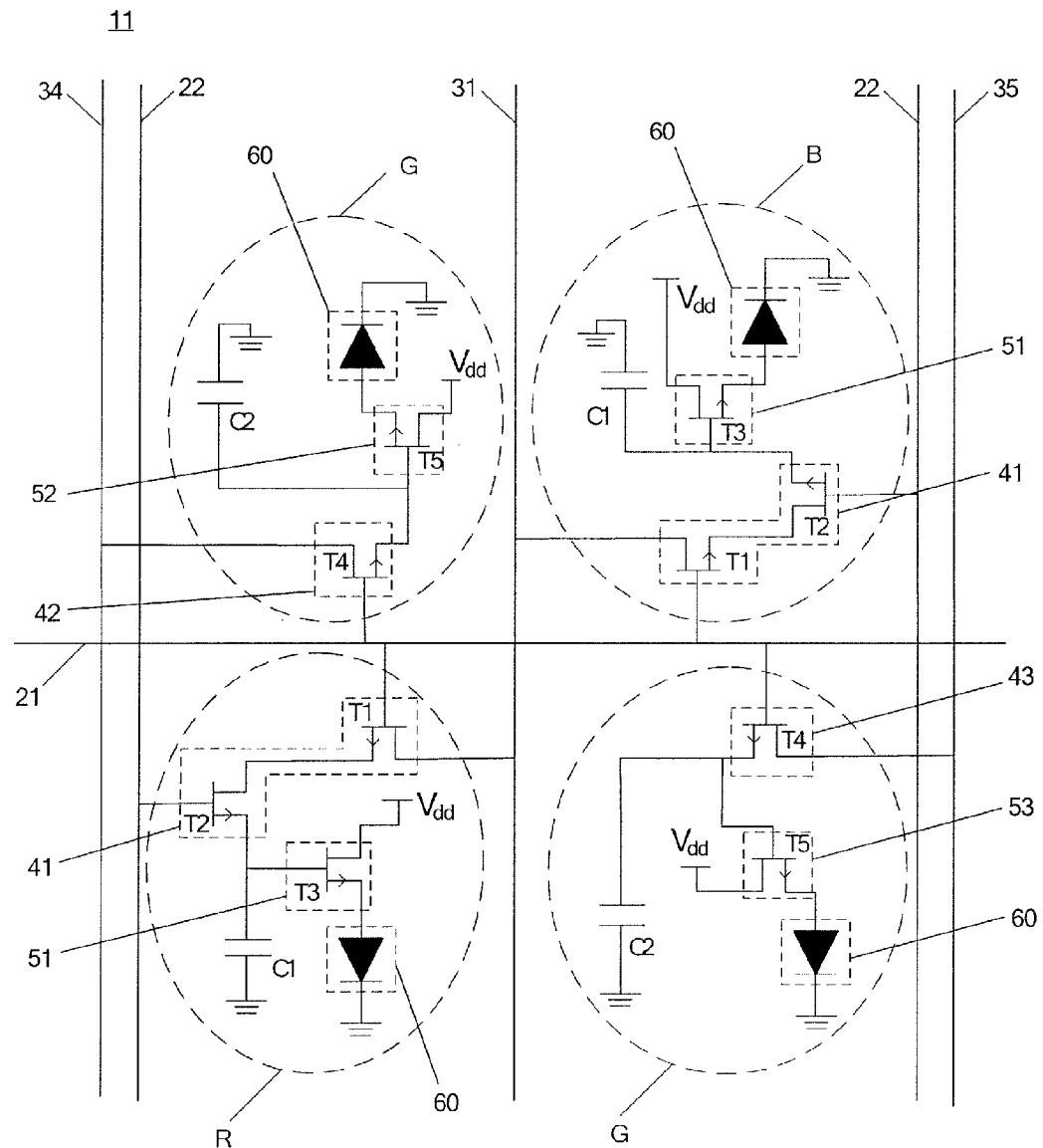
FIG. 9 is another structural representation of the virtual pixel unit 11 in FIG. 7.

Regarding a first type of circuit structure, referring to FIG. 9, the first control unit 41 may comprise a first thin film transistor T1 and a second thin film transistor T2. Specifically, a gate of the first thin film transistor T1 is connected with the first scan line 21, a drain of the first thin film transistor T1 is connected with a source of the second thin film transistor T2, and a source of the first thin film transistor T1 is connected with the first data line 31; a gate of the second thin film transistor T2 is connected with the second scan line 22, and a drain of the second thin film transistor T2 is connected with the first driving unit 51.

Figure 10:
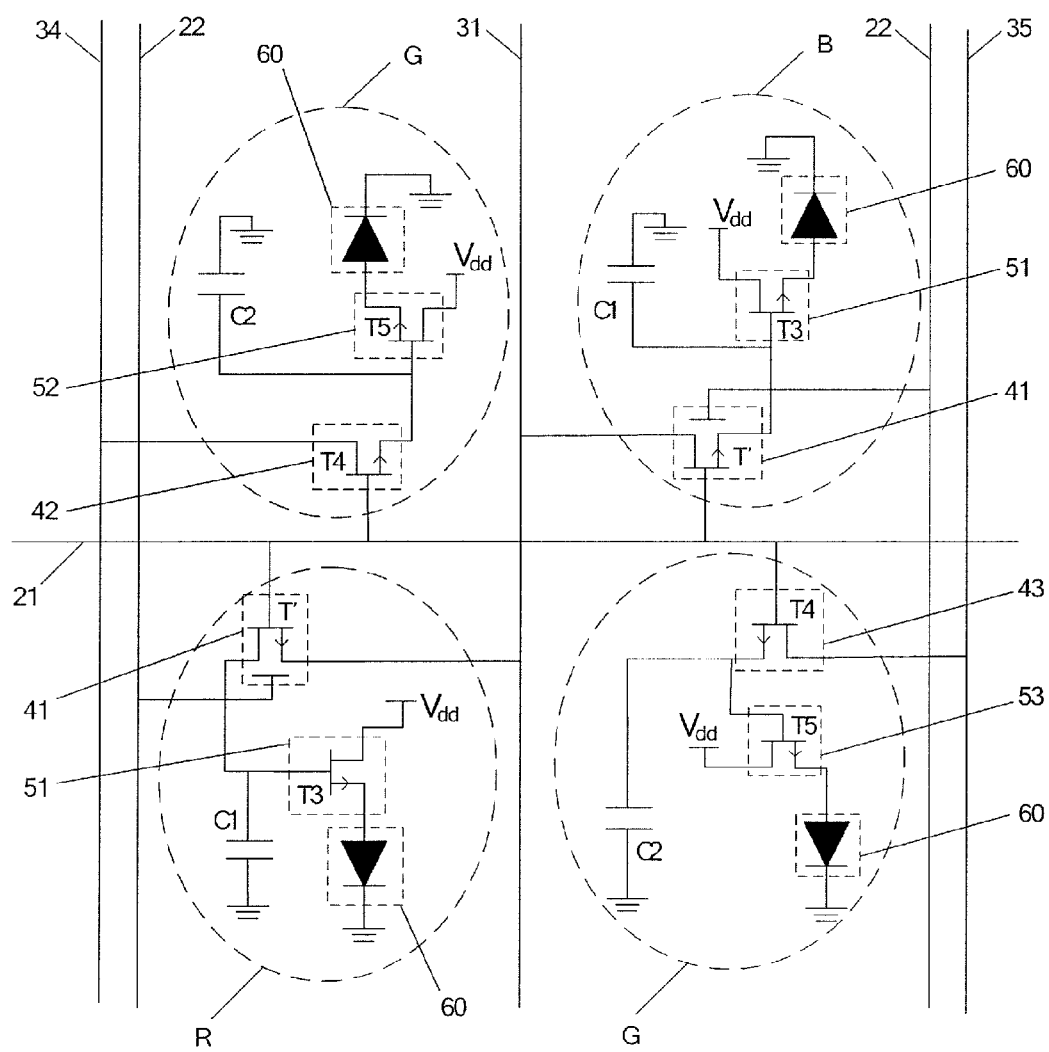
FIG. 10 is yet another structural representation of the virtual pixel unit 11 in FIG. 7.

Regarding a second type of circuit structure, referring to FIG. 10, the first control unit 41 may further comprise a Dual-Gate type thin film transistor T'. Specifically, a first gate of the Dual-Gate type thin film transistor T' is connected with the first scan line 21, a second gate of the Dual-Gate type thin film transistor T' is connected with the second scan line 22, a drain of the Dual-Gate type thin film transistor T' is connected with the first driving unit 51, and a source of the Dual-Gate type thin film transistor T' is connected with the first data line 31.

It should be noted that the method for manufacturing a Dual-Gate type thin film transistor may be similar to the related description for the first embodiment, and the details will not be repeated herein.

Optionally, referring to FIG. 9 and FIG. 10, the first driving unit 51 may comprise a third thin film transistor T3. A gate of the third thin film transistor T3 is connected with the first control unit 41, a source of the third thin film transistor T3 is connected with a power line Vdd, and a drain of the third thin film transistor T3 is connected with the organic light emitting diode 60. It should be noted that the first driving unit may also be formed of other circuit components and parts, and there is no limitation on it, as long as the organic light emitting diode may be driven to emit light under the control of the first control unit.

Optionally, referring to FIG. 9 and FIG. 10, each of the R sub-pixel and the B sub-pixel may further comprise a storage capacitor Cl, and one terminal of the storage capacitor C1 is connected with the first control unit 41 and the first driving unit 51 respectively, and the other terminal is grounded. It should be noted that no limitation is made on the number of the storage capacitors in the embodiments of the present disclosure; and the embodiments of the present disclosure and the drawings are explained by taking a case that each of the R sub-pixel and the B sub-pixel comprises one storage capacitor as an example.

Optionally, referring to FIG. 8, the first G sub-pixel in each virtual pixel unit may comprise a second control unit 42, a second driving unit 52, and an organic light emitting diode 60. Wherein, the second control unit 42 is connected with the first scan line 21, the fourth data line 34, and the second driving unit 52 respectively.

Optionally, referring to FIG. 9 and FIG. 10, the second control unit 42 may comprise a fourth thin film transistor T4. Specifically, a gate of the fourth thin film transistor T4 is connected with the first scan line 21, a source of the fourth thin film transistor T4 is connected with the fourth data line 34, and a drain of the fourth thin film transistor T4 is connected with the second driving unit 52. Optionally, the second driving unit 52 may comprise a fifth thin film transistor T5. Specifically, a gate of the fifth thin film transistor T5 is connected with the second control unit 42, a source of the fifth thin film transistor 15 is connected with a power line, and a drain of the fifth thin film transistor T5 is connected with the organic light emitting diode 60.

Of course, the first the G sub-pixel may also comprise a storage capacitor C2, and one terminal of the storage capacitor C2 is connected with the second control unit 42 and the second driving unit 52 respectively, and the other terminal is grounded.

The second G sub-pixel of each of the virtual pixels may comprise a third control unit 43, a third driving unit 53, and an organic light emitting diode 60. Wherein, the third control unit 43 is connected with the first scan line 21, the fifth data line 35, and the third driving unit 53 respectively. The detailed structures of the third control unit and the third driving unit may be similar to those of the second control unit and the second driving unit described above, and the details will not be repeated herein.

Third Embodiment

An embodiment of the present disclosure provides a display apparatus comprising any one of the display substrates provided in the first embodiment or the second embodiment. The display apparatus may be a display device such as OLED display as well as a television, a digital camera, a handset, a tablet computer, and any product or component having, display functions which includes such a display device therein.

Fourth Embodiment

An embodiment of the present disclosure provides a method for driving a display apparatus comprising any one of the display substrates provided in the first embodiment, the method comprises steps as follows.

During a first scanning period, a scanning signal is input to the R sub-pixel, the G sub-pixel and the B sub-pixel in the pixel unit by the first scan line.

During a first time period of the first scanning period, a R data signal is input to the R sub-pixel by the first data line.

During a second time period of the first scanning period, a B data signal is input to the B sub-pixel by the first data line.

During the first time period and the second time period of the first scanning period, a G data signal is input to the G sub-pixel by the second data line. Wherein, the first time period and the second time period of the first scanning period are different time periods.

An embodiment of the present disclosure provides a method for driving a display apparatus, the display apparatus comprises any one of the display substrates provided in the first embodiment, the display substrate comprises a plurality of pixel units arranged in an array, each pixel unit at least comprises a R sub-pixel, a G sub-pixel and a B sub-pixel; and the R sub-pixels, the G sub-pixels and the B sub-pixels of the pixel units in each row are connected with one first scan line; the R sub-pixel and the B sub-pixel of each pixel unit are connected with one first data line, and the G sub-pixel is connected with one second data line; the driving method comprises: providing a R data signal to the R sub-pixel during a first time period and providing a B data signal to the B sub-pixel during the second time period, by the first data line; providing a G data signal to the G sub-pixel by the second data line during the first time period and the second time period, and the first time period and the second time period are different time periods.

As compared with a display apparatus in which each sub-pixel needs an individual data line to be driven, for a display apparatus comprising the display substrate as described above, the number of the data lines are reduced greatly and thus the display apparatus can have a higher aperture ratio with the same high resolution, because the R sub-pixel and the B sub-pixel in each pixel unit share the one first data line.

Optionally, to improve the displaying effect, durations of the first time period and the second time period are the same.

Further, during the first time period of the first scanning period, inputting the R data signal to the R sub-pixel by the first data line specifically comprises: during the first time period of the first scanning period, inputting the R data signal to the first control unit of the R sub-pixel and the first control unit of the B sub-pixel by the first data line; inputting an enabling signal to the first control unit of the R sub-pixel by the second scan line connected with the R sub-pixel; and inputting a disabling signal to the first control unit of the B sub-pixel by the second scan line connected with the B sub-pixel, so that the R data signal is input to the first driving unit of the R sub-pixel so as to drive the red organic light emitting diode to emit light.

During the second time period of the first scanning period, inputting the B data signal to the B sub-pixel by the first data line specifically comprises: during the second time period of the first scanning period, inputting the B data signal to the first control unit of the R sub-pixel and the first control unit of the B sub-pixel by the first data line; inputting an enabling signal to the first control unit of the B sub-pixel by the second scan line connected with the B sub-pixel; and inputting a disabling signal to the first control unit of the R sub-pixel by the second scan line connected with the R sub-pixel, so that the B data signal is input to the first driving unit of the B sub-pixel so as to drive the blue organic light emitting diode to emit light.

Figure 11:
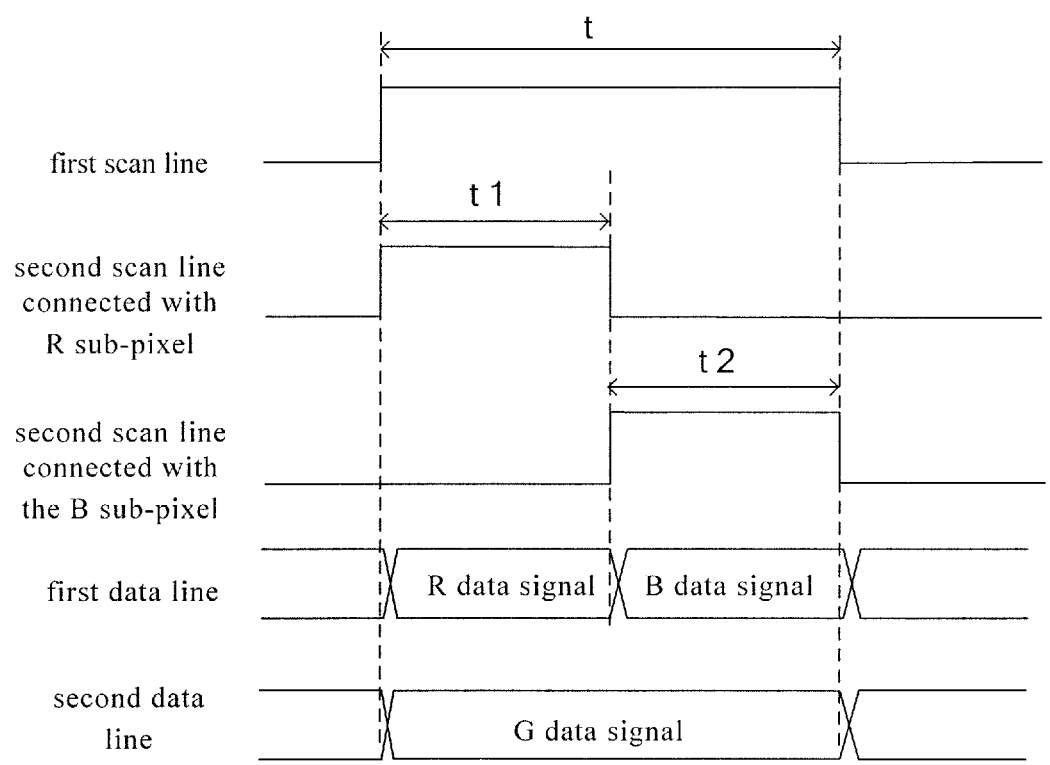
FIG. 11 is a timing diagram for driving the OLED display apparatus according to an embodiment of the present disclosure.

Hereinafter, the above driving method will be explained in detail by taking a display apparatus including the display substrate as shown in FIG. 4 as an example. The driving method specifically comprises:

referring to FIG. 11, during a first scanning period t, a scanning signal is input to the R sub-pixel, the G sub-pixel and the B sub-pixel in the pixel unit by the first scan line 21.

During a first time period t1 of the first scanning period t, the first data line 31 inputs the R data signal to the source of the first thin film transistor T1 of the first control unit 41 of the R sub-pixel, and to the source of the first thin film transistor T1 of the first control unit 41 of the B sub-pixel; the first thin film transistor T1 of the R sub-pixel and the first thin film transistor T1 of the B sub-pixel are turned on; a high level is input to the gate of the second thin film transistor T2 of the R sub-pixel by the second scan line 22 connected with the R sub-pixel, then the second thin film transistor T2 of the R sub-pixel is turned on; the R data signal is input to the third thin film transistor T3 of the first driving unit 51 of the R sub-pixel so as to drive the red organic light emitting diode to emit light, meanwhile the storage capacitor of the R sub-pixel is charged; a low level is input to the gate of the second thin film transistor T2 of the B sub-pixel by the second scan line 22 connected with the B sub-pixel, then the second thin film transistor T2 of the B sub-pixel is turned off.

During a second time period t2 of the first scanning period t, the first data line 31 inputs the B data signal to the source of the first thin film transistor T1 of the first control unit 41 of the R sub-pixel, and to the source of the first thin film transistor T1 of the first control unit 41 of the B sub-pixel; and the first thin film transistor T1 of the R sub-pixel and the first thin film transistor T1 of the B sub-pixel are turned on; the high level is input to the gate of the second thin film transistor T2 of the B sub-pixel by the second scan line connected with the B sub-pixel, then the second thin film transistor T2 of the B sub-pixel is turned on; the B data signal is input to the third thin film transistor T3 of the first driving unit 51 of the B sub-pixel so as to drive the blue organic light emitting diode to emit light, meanwhile the storage capacitor of the B sub-pixel is charged; the low level is input to the gate of the second thin film transistor T2 of the R sub-pixel by the second scan line 22 connected with the R sub-pixel, then the second thin film transistor T2 of the R sub-pixel is turned off, and the storage capacitor of the R sub-pixel is discharged to maintain the displaying of the first time period until the end of the second time period.

During the first time period t1 and the second time period t2 of the first scanning period t, the G data signal is input to the G sub-pixel by the second data line 32.

As such, during different scanning periods, the above processes are repeated to realize the scanning from the first row to the last row, and thus a displaying of one picture is realized in one scan period. By performing the scanning of a plurality of scanning periods, the displaying of continuous pictures may be achieved.

Fifth Embodiment

An embodiment of the present disclosure provides a method for driving a display apparatus comprising any one of the display substrates provided in the second embodiment, the method comprises steps as follows.

During a first scanning period, the scanning signal is input to the R sub-pixel, the first G sub-pixel, the B sub-pixel and the second G sub-pixel in the virtual pixel unit by the first scan line.

During a first time period of the first scanning period, the R data signal is provided to the R sub-pixel by the first data line.

During a second time period of the first scanning period, the B data signal is provided to the B sub-pixel by the first data line.

During the first time period and the second time period of the first scanning period, the first G data signal is provided to the first G sub-pixel by the fourth data line, and the second G data signal is provided to the second G sub-pixel by the fifth data line. Wherein, the first time period and the second time period are different time periods.

An embodiment of the present disclosure provides a method for driving a display apparatus, the display apparatus comprises any one of the display substrates provided in the second embodiment, the display substrate comprises a plurality of virtual pixel units arranged in an array, and each of the virtual pixel units comprises a first virtual sub-pixel unit and a second virtual sub-pixel unit, and the first virtual sub-pixel unit comprises a R sub-pixel and a first G sub-pixel, the second virtual sub-pixel unit comprises a B sub-pixel and a second G sub-pixel; the R sub-pixels, the first G sub-pixels, the B sub-pixels and the second G sub-pixels of the virtual pixel units in each row are connected with one first scan line; in each virtual pixel unit, the R sub-pixel of the first virtual sub-pixel unit and the B sub-pixel of the second virtual sub-pixel unit are connected with one first data line; in each virtual pixel unit, the first G sub-pixel of the first virtual sub-pixel unit is connected with the fourth data line, and the second G sub-pixel of the second virtual sub-pixel unit is connected with the fifth data line; the driving method comprises: providing the R data signal to the R sub-pixel by the first data line during the first time period; providing the B data signal to the B sub-pixel during the second time period; providing the first G data signal to the first G sub-pixel by the fourth data line during the first time period and the second time period; and providing the second G data signal to the second G sub-pixel by the fifth data line during the first time period and the second time period.

As compared with a display apparatus in which each sub-pixel needs an individual data line to be driven, for a display apparatus comprising the display substrate as described above, the number of the data lines are reduced greatly and thus the display apparatus can have a higher aperture ratio with the same high resolution, because the R sub-pixel and the B sub-pixel in each pixel unit share the one first data line.

Optionally, to improve the displaying effect, the durations of the first time period and the second time period are the same.

Further, during the first time period of the first scanning period, inputting the R data signal to the R sub-pixel by the first data line specifically comprises: during the first time period of the first scanning period, inputting the R data signal to the first control unit of the R sub-pixel and the first control unit of the B sub-pixel by the first data line; inputting an enabling signal to the first control unit of the R sub-pixel by the second scan line connected with the R sub-pixel; and inputting an disabling signal to the first control unit of the B sub-pixel by the second scan line connected with the B sub-pixel, so that the R data signal is input to the first driving unit of the R sub-pixel so as to drive the red organic light emitting diode to emit light.

During the second time period of the first scanning period, inputting the B data signal to the B sub-pixel by the first data line specifically comprises: during the second time period of the first scanning period, inputting the B data signal to the first control unit of the R sub-pixel and the first control unit of the B sub-pixel by the first data line; inputting an enabling signal to the first control unit of the B sub-pixel by the second scan line connected with the B sub-pixel; and inputting a disabling signal to the first control unit of the R sub-pixel by the second scan line connected with the R sub-pixel, so that the B data signal is input to the first driving unit of the b sub-pixel so as to drive the blue organic light emitting diode to emit light.

Figure 12:
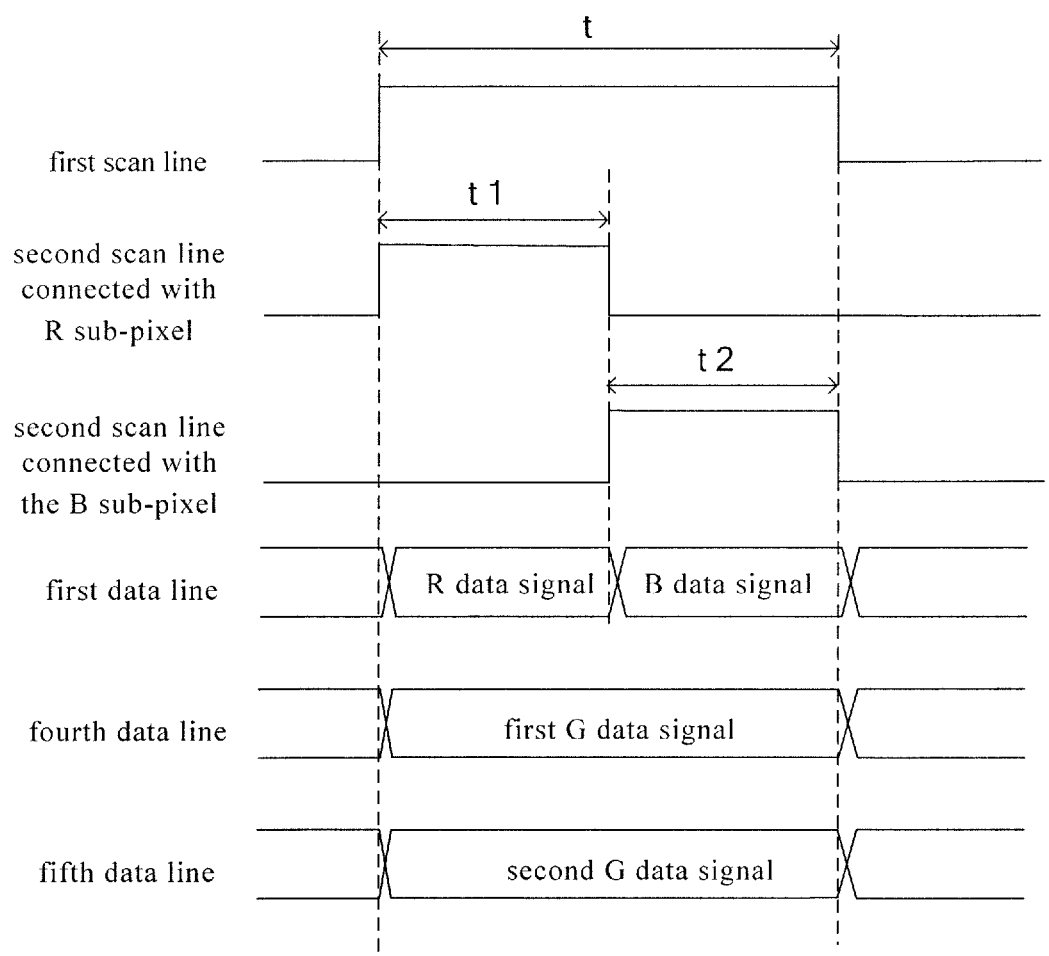
FIG. 12 is another timing diagram for driving the OLED display apparatus according to an embodiment of the present disclosure.

Hereinafter, the above driving method will be explained in details by taking a display apparatus including the display substrate as shown in FIG. 9 as an example. The driving method specifically comprises:

referring to FIG. 12, during a first scanning period t, a scanning signal is input to the R sub-pixel, the first G sub-pixel, the B sub-pixel and the second G sub-pixel in a virtual pixel unit by the first scan line 21.

During a first time period t1 of the first scanning period t, the first data line 21 inputs the R data signal to the source of the first thin film transistor T1 of the first control unit 41 of the R sub-pixel, and to the source of the first thin film transistor T1 of the first control unit 41 of the B sub-pixel; the first thin film transistor T1 of the R sub-pixel and the first thin film transistor Ti of the B sub-pixel are turned on; the second scan line 22 connected with the R sub-pixel inputs a high level to the gate of the second thin film transistor T2 of the R sub-pixel, then the second thin film transistor T2 of the R sub-pixel is turned on, the R data signal is input to the third thin film transistor T3 of the first driving unit 51 of the R sub-pixel so as to drive red organic light emitting diode to emit light, meanwhile the storage capacitor of the R sub-pixel is charged; the second scan line 22 connected with the B sub-pixel inputs a low level is input to the gate of the second thin film transistor T2 of the B sub-pixel, then the second thin film transistor T2 of the B sub-pixel is turned off.

During a second time period t2 of the first scanning period t, the first data line 31 inputs the B data signal to the source of the first thin film transistor T1 of the first control unit 41 of the R sub-pixel, and to the source of the first thin film transistor T1 of the first control unit 41 of the B sub-pixel; the first thin film transistor T1 of the R sub-pixel and the first thin film transistor T1 of the B sub-pixel are turned on; the second scan line 22 connected with the B sub-pixel inputs a high level to the gate of the second thin film transistor T2 of the B sub-pixel, then the second thin film transistor T2 of the B sub-pixel is turned on, the B data signal is input to the third thin film transistor T3 of the first driving unit 51 of the B sub-pixel so as to drive the blue organic light emitting diode to emit light, meanwhile the storage capacitor of the B sub-pixel is charged; the second scan line 22 connected with the R sub-pixel inputs a low level to the gate of the second thin film transistor T2 of the R sub-pixel, then the second thin film transistor T2 of the R sub-pixel is turned off, and the storage capacitor of the R sub-pixel is discharged to maintain the displaying of the first time period until the end of the second time period.

During the first time period t1 and the second time period t2 of the first scanning period t, the fourth data line 34 provides the first G data signal to the first G sub-pixel, and the fifth data line 35 provides the second G data signal to the second G sub-pixel.

Accordingly, during different scanning periods, the above processes are repeated to realize the scanning from the first row to the last row, and thus the displaying of one picture is realized in one scan period. By performing scanning in a plurality of scanning periods, displaying of continuous pictures may be achieved.

The above descriptions only illustrate the specific embodiments of the present invention, and the protection scope of the present disclosure is not limited to this. Given the teaching as disclosed herein, variations or substitutions, which can easily occur to any skilled pertaining to the art, should be covered by the protection scope of the present invention. Thus, the protection scope of the present disclosure is defined by the claims.

This application claims priority to China Patent Application No. 201510266982.3, filed on May 22, 2015, and the content of which in its entirety is herein incorporated by reference as part of the present application.

What is claimed is:

1. A display substrate, comprising a plurality of pixel units arranged in an array, each of the pixel units at least comprises a R sub-pixel, a G sub-pixel and a B sub-pixel; wherein, the R sub-pixels, the G sub-pixels and the B sub-pixels of the pixel units in each row are connected with one first scan line;

in each of the pixel units, the R sub-pixel and the B sub-pixel are connected with one first data line, and the first data line is configured to provide a R data signal to the R sub-pixel during a first time period and to provide a B data signal to the B sub-pixel during a second time period;

in each of the pixel units, the G sub-pixel is connected with one second data line, and the second data line is configured to provide a G data signal to the G sub-pixel during the first time period and the second time period;

wherein, the first time period and the second time period are different time periods, wherein each of the R sub-pixel and the B sub-pixel comprises a first control unit, a first driving unit, and an organic light emitting diode, the first control unit is connected with the first scan line, a second scan line, the first data line, and the first driving unit respectively, wherein the first data line provides the R data signal to the R sub-pixel during the first time period comprises:

during the first time period, the R data signal is input to the first control unit of the R sub-pixel and the first control unit of the B sub-pixel by the first data line; and an enabling signal is input to the first control unit of the R sub-pixel by the second scan line connected with the R sub-pixel; and a disabling signal is input to the first control unit of the B sub-pixel by the second scan line connected with the B sub-pixel, so that the R data signal is input to the first driving unit of the R sub-pixel to drive the red organic light emitting diode to emit light, and wherein the first data line provides the B data signal to the B sub-pixel during the second time period comprises:

during the second time period of the first scanning period, the B data signal is input to the first control unit of the R sub-pixel and the first control unit of the B sub-pixel by the first data line; and an enabling signal is input to the first control unit of the B sub-pixel by the second scan line connected with the B sub-pixel; and a disabling signal is input to the first control unit of the R sub-pixel by the second scan line connected with the R sub-pixel, so that the B data signal is input to the first driving unit of the B sub-pixel to drive the blue organic light emitting diode to emit light.

2. The display substrate as claimed in claim 1, wherein, the first control unit comprises a first thin film transistor and a second thin film transistor;
a gate of the first thin film transistor is connected with the first scan line, a drain thereof is connected with a source of the second thin film transistor, and a source thereof is connected with the first data line; and
a gate of the second thin film transistor is connected with the second scan line, and a drain thereof is connected with the first driving unit.

3. The display substrate as claimed in claim 1, wherein, the first control unit comprises a Dual-Gate type thin film transistor;
a first gate of the Dual-Gate type thin film transistor is connected with the first scan line, a second gate thereof is connected with the second scan line, a drain thereof is connected with the first driving unit, and a source thereof is connected with the first data line.

4. The display substrate as claimed in claim 1, wherein, the first driving unit comprises a third thin film transistor;
a gate of the third thin film transistor is connected with the first control unit, a source thereof is connected with a power line, and a drain thereof is connected with the organic light emitting diode.

5. The display substrate as claimed in claim 1, wherein, each of the R sub-pixel and the B sub-pixel further comprises a storage capacitor, one terminal of the storage capacitor is connected with the first control unit and the first driving unit respectively, and the other terminal thereof is grounded.

6. A display apparatus, comprising a display substrates, the display substrate comprises a plurality of pixel units arranged in an array, each of the pixel units at least comprises a R sub-pixel, a G sub-pixel and a B sub-pixel; wherein, the R sub-pixels, the G sub-pixels and the B sub-pixels of the pixel units in each row are connected with one first scan line;
in each of the pixel units, the R sub-pixel and the B sub-pixel are connected with one first data line, and the first data line is configured to provide a R data signal to the R sub-pixel during a first time period and to provide a B data signal to the B sub-pixel during a second time period;
in each of the pixel units, the G sub-pixel is connected with one second data line, and the second data line is configured to provide a G data signal to the G sub-pixel during the first time period and the second time period;
wherein, the first time period and the second time period are different time periods,
wherein each of the R sub-pixel and the B sub-pixel comprises a first control unit, a first driving unit, and an organic light emitting diode,
the first control unit is connected with the first scan line, a second scan line, the first data line, and the first driving unit respectively,
wherein the first data line provides the R data signal to the R sub-pixel during the first time period comprises:
during the first time period, the R data signal is input to the first control unit of the R sub-pixel and the first control unit of the B sub-pixel by the first data line; and an enabling signal is input to the first control unit of the R sub-pixel by the second scan line connected with the R sub-pixel; and a disabling signal is input to the first control unit of the B sub-pixel by the second scan line connected with the B sub-pixel, so that the R data signal is input to the first driving unit of the R sub-pixel to drive the red organic light emitting diode to emit light, and
wherein the first data line provides the B data signal to the B sub-pixel during the second time period comprises:
during the second time period of the first scanning period, the B data signal is input to the first control unit of the R sub-pixel and the first control unit of the B sub-pixel by the first data line; and an enabling signal is input to the first control unit of the B sub-pixel by the second scan line connected with the B sub-pixel; and a disabling signal is input to the first control unit of the R sub-pixel by the second scan line connected with the R sub-pixel, so that the B data signal is input to the first driving unit of the B sub-pixel to drive the blue organic light emitting diode to emit light.

7. The display apparatus as claimed in claim 6, wherein, the first control unit comprises a first thin film transistor and a second thin film transistor;
a gate of the first thin film transistor is connected with the first scan line, a drain thereof is connected with a source of the second thin film transistor, and a source thereof is connected with the first data line; and
a gate of the second thin film transistor is connected with the second scan line, and a drain thereof is connected with the first driving unit.

8. The display apparatus as claimed in claim 6, wherein, the first control unit comprises a Dual-Gate type thin film transistor;
a first gate of the Dual-Gate type thin film transistor is connected with the first scan line, a second gate thereof is connected with the second scan line, a drain thereof is connected with the first driving unit, and a source thereof is connected with the first data line.

9. The display apparatus as claimed in claim 6, wherein, the first driving unit comprises a third thin film transistor;
a gate of the third thin film transistor is connected with the first control unit, a source thereof is connected with a power line, and a drain thereof is connected with the organic light emitting diode.

10. The display apparatus as claimed in claim 6, wherein, each of the R sub-pixel and the B sub-pixel further comprises a storage capacitor, one terminal of the storage capacitor is connected with the first control unit and the first driving unit respectively, and the other terminal thereof is grounded.

11. A method for driving a display apparatus comprising a display substrates, the method comprises:
during a first scanning period, a scanning signal is input to a R sub-pixel, a G sub-pixel and a B sub-pixel in a pixel unit by a first scan line;
during a first time period of the first scanning period, a R data signal is input to the R sub-pixel by a first data line;
during a second time period of the first scanning period, a B data signal is input to the B sub-pixel by the first data line;

during the first time period and the second time period of the first scanning period, a G data signal is input to the G sub-pixel by a second data line;

wherein, the first time period and the second time period of the first scanning period are different time periods, wherein the display substrate comprises a plurality of pixel units arranged in an array, each of the pixel units at least comprises a R sub-pixel, a G sub-pixel and a B sub-pixel; wherein, the R sub-pixels, the G sub-pixels and the B sub-pixels of the pixel units in each row are connected with one first scan line;

in each of the pixel units, the R sub-pixel and the B sub-pixel are connected with one first data line, and the first data line is configured to provide a R data signal to the R sub-pixel during a first time period and to provide a B data signal to the B sub-pixel during a second time period;

in each of the pixel units, the G sub-pixel is connected with one second data line, and the second data line is configured to provide a G data signal to the G sub-pixel during the first time period and the second time period;

wherein, the first time period and the second time period are different time periods, wherein inputting the R data signal to the R sub-pixel by the first data line during the first time period of the first scanning period specifically comprises:

during the first time period of the first scanning period, the R data signal is input to a first control unit of the R sub-pixel and a first control unit of the B sub-pixel by the first data line; and an enabling signal is input to the first control unit of the R sub-pixel by a second scan line connected with the R sub-pixel; and a disabling signal is input to the first control unit of the B sub-pixel by a second scan line connected with the B sub-pixel, so that the R data signal is input to the first driving unit of the R sub-pixel to drive the red organic light emitting diode to emit light;

inputting the B data signal to the B sub-pixel by the first data line during the second time period of the first scanning period specifically comprises:

during the second time period of the first scanning period, the B data signal is input to the first control unit of the R sub-pixel and the first control unit of the B sub-pixel by the first data line; and an enabling signal is input to the first control unit of the B sub-pixel by the second scan line connected with the B sub-pixel; and a disabling signal is input to the first control unit of the R sub-pixel by the second scan line connected with the R sub-pixel, so that the B data signal is input to the first driving unit of the B sub-pixel to drive the blue organic light emitting diode to emit light.

12. The driving method as claimed in claim 11, wherein, durations of the first time period and the second time period are the same.

13. The driving method as claimed in claim 11, wherein, each of the R sub-pixel and the B sub-pixel comprises the first control unit, a first driving unit, and an organic light emitting diode;

the first control unit is connected with the first scan line, the second scan line, the first data line, and the first driving unit respectively;

during the first time period, under the control of the second scan line connected with the R sub-pixel, the first control unit of the R sub-pixel is configured to input the R data signal provided by the first data line to the first driving unit in the R sub-pixel to drive the organic light emitting diode in the R sub-pixel to emit light;

during the second time period, under the control of the second scan line connected with the B sub-pixel, the first control unit of the B sub-pixel is configured to input the B data signal provided by the first data line to the first driving unit in the B sub-pixel to drive the organic light emitting diode in the B sub-pixel to emit light.

14. The driving method as claimed in claim 13, wherein, the first control unit comprises a first thin film transistor and a second thin film transistor;

a gate of the first thin film transistor is connected with the first scan line, a drain thereof is connected with a source of the second thin film transistor, and a source thereof is connected with the first data line; and a gate of the second thin film transistor is connected with the second scan line, and a drain thereof is connected with the first driving unit.

15. The driving method as claimed in claim 13, wherein, the first control unit comprises a Dual-Gate type thin film transistor;

a first gate of the Dual-Gate type thin film transistor is connected with the first scan line, a second gate thereof is connected with the second scan line, a drain thereof is connected with the first driving unit, and a source thereof is connected with the first data line.

16. The driving method as claimed in claim 13, wherein, the first driving unit comprises a third thin film transistor;

a gate of the third thin film transistor is connected with the first control unit, a source thereof is connected with a power line, and a drain thereof is connected with the organic light emitting diode.

* * * * *